United States Patent
Zang et al.

(10) Patent No.: US 10,147,648 B1
(45) Date of Patent: Dec. 4, 2018

(54) VERTICAL FIN GATE STRUCTURE FOR RF DEVICE

(71) Applicant: GLOBALFOUNDRIES INC., Grand Cayman (KY)

(72) Inventors: Hui Zang, Guilderland, NY (US); Josef Watts, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/830,217

(22) Filed: Dec. 4, 2017

(51) Int. Cl.
| H01L 21/8234 | (2006.01) |
| H01L 29/66 | (2006.01) |
| H01L 29/10 | (2006.01) |
| H01L 29/417 | (2006.01) |
| H01L 21/84 | (2006.01) |
| H01L 29/78 | (2006.01) |

(52) U.S. Cl.
CPC .... *H01L 21/823431* (2013.01); *H01L 21/845* (2013.01); *H01L 29/105* (2013.01); *H01L 29/41791* (2013.01); *H01L 29/6656* (2013.01); *H01L 29/66666* (2013.01); *H01L 29/66795* (2013.01); *H01L 29/7827* (2013.01)

(58) Field of Classification Search
None
See application file for complete search history.

(56) References Cited

U.S. PATENT DOCUMENTS 9,899,515 B1 * 2/2018 Cheng ................ H01L 29/7827

OTHER PUBLICATIONS

Burghartz, J. "Tailoring Logic CMOS for RF Applications"; IEEE Conference, Apr. 18-20, 2001; Accession No. 7068849; pp. 150-153.

* cited by examiner

*Primary Examiner* — Joseph Schoenholtz
(74) *Attorney, Agent, or Firm* — Scully Scott Murphy and Presser; Frank Digiglio

(57) ABSTRACT

A vertical FinFET structure includes a metal layer disposed between adjacent fins of a multi-fin device. The metal layer, which is in electrical contact with a self-aligned work function metal layer, is adapted to decrease the overall resistance of the gate contact for the device. A lower gate contact resistance can improve the reliability and performance of the device, particularly in radio frequency (RF) applications. The metal layer can also extend laterally to provide a contact region for a gate contact.

17 Claims, 11 Drawing Sheets

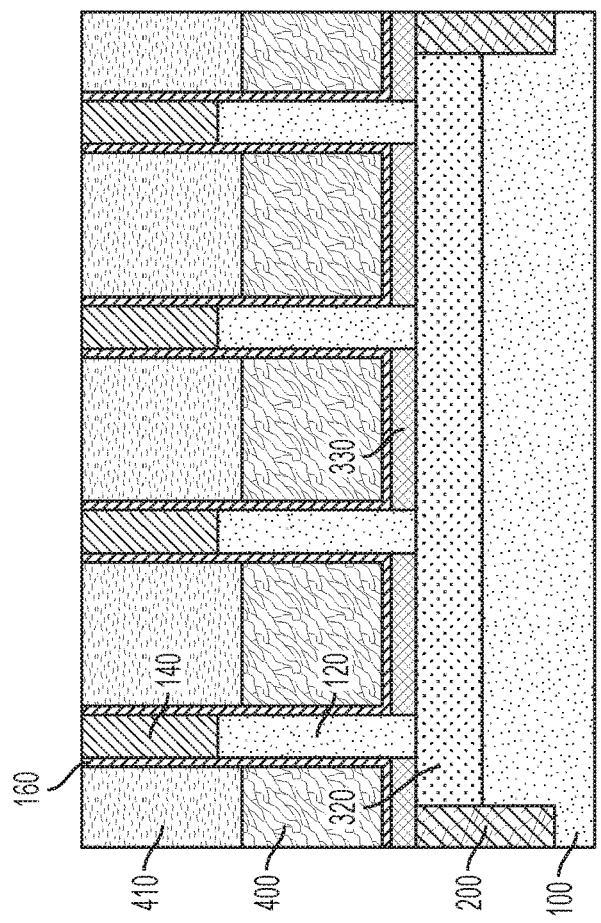
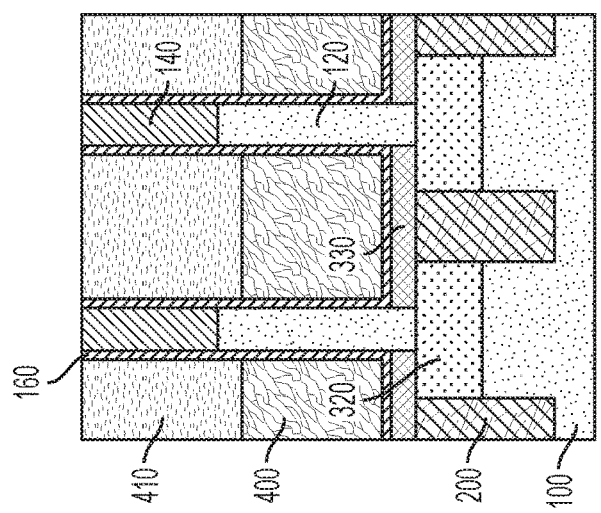
FIG. 2B
FIG. 2A

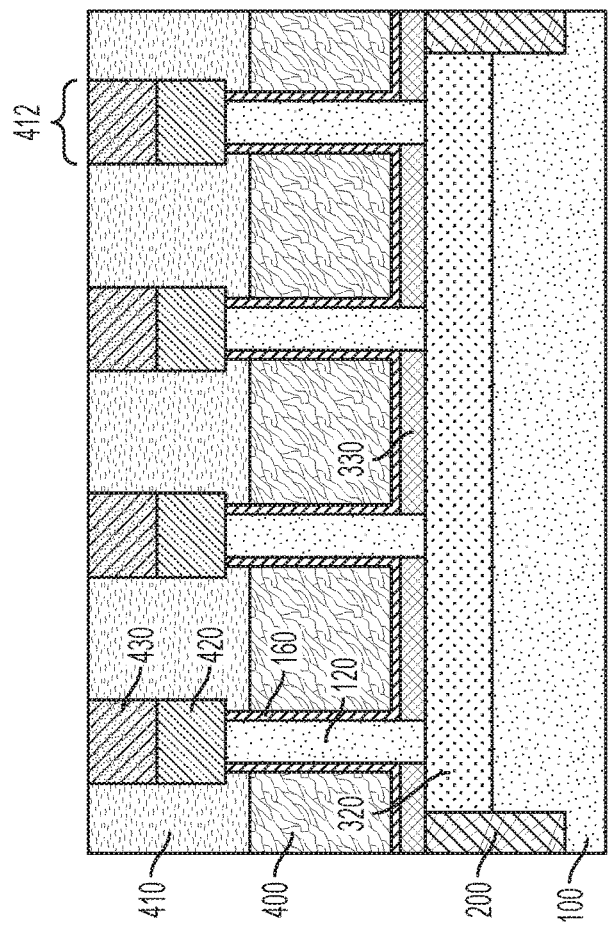
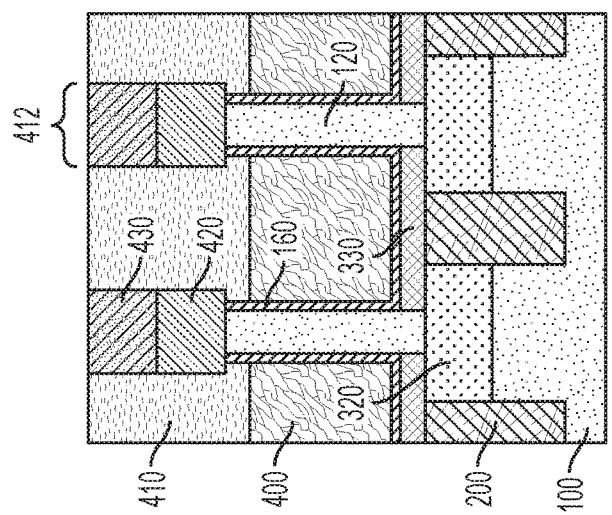

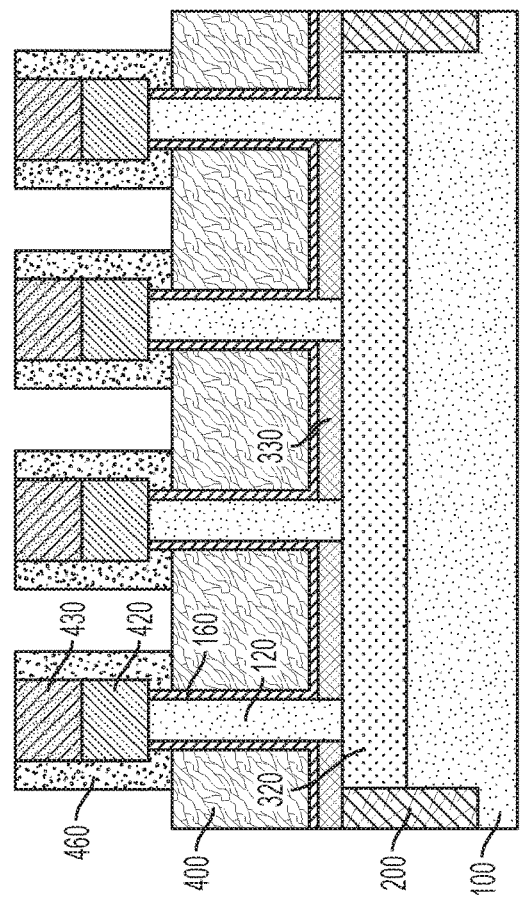
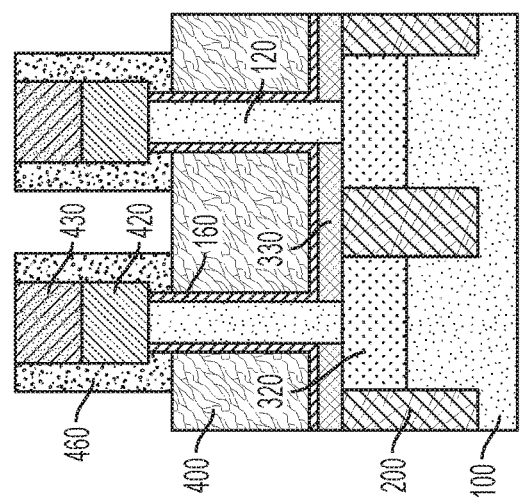
FIG. 4A
FIG. 4B

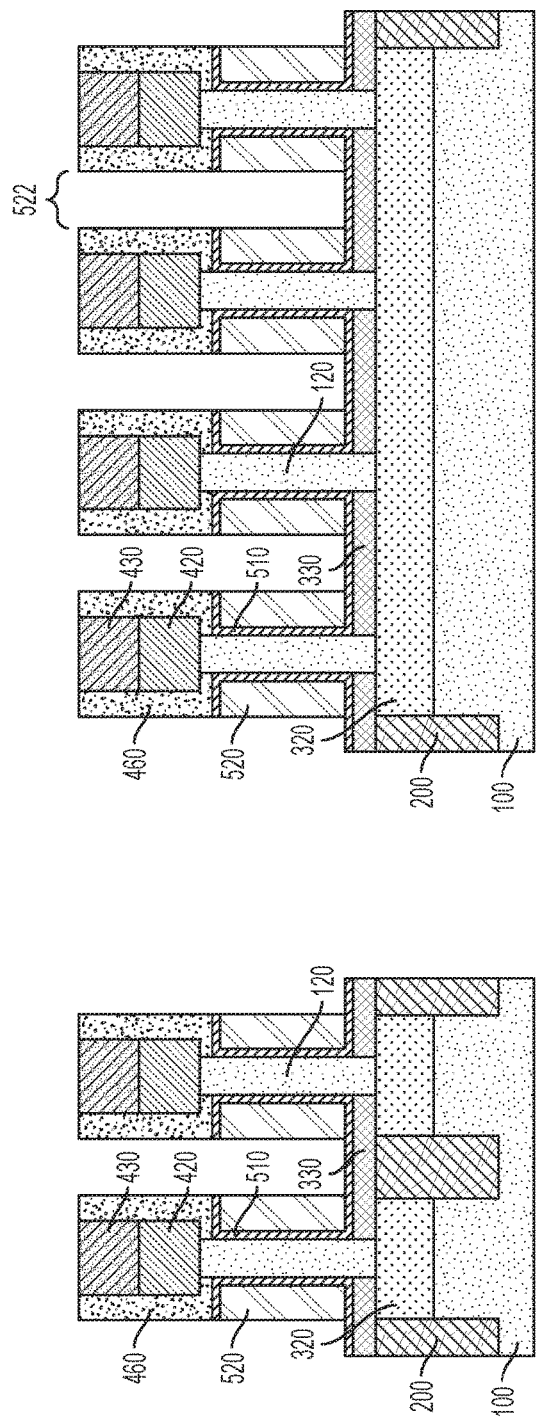
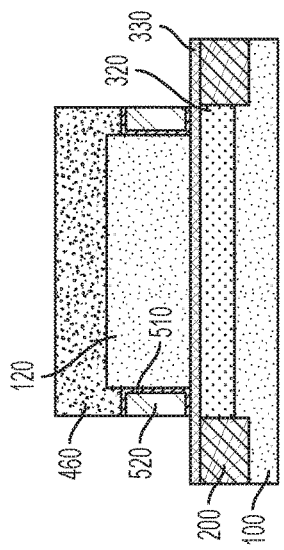

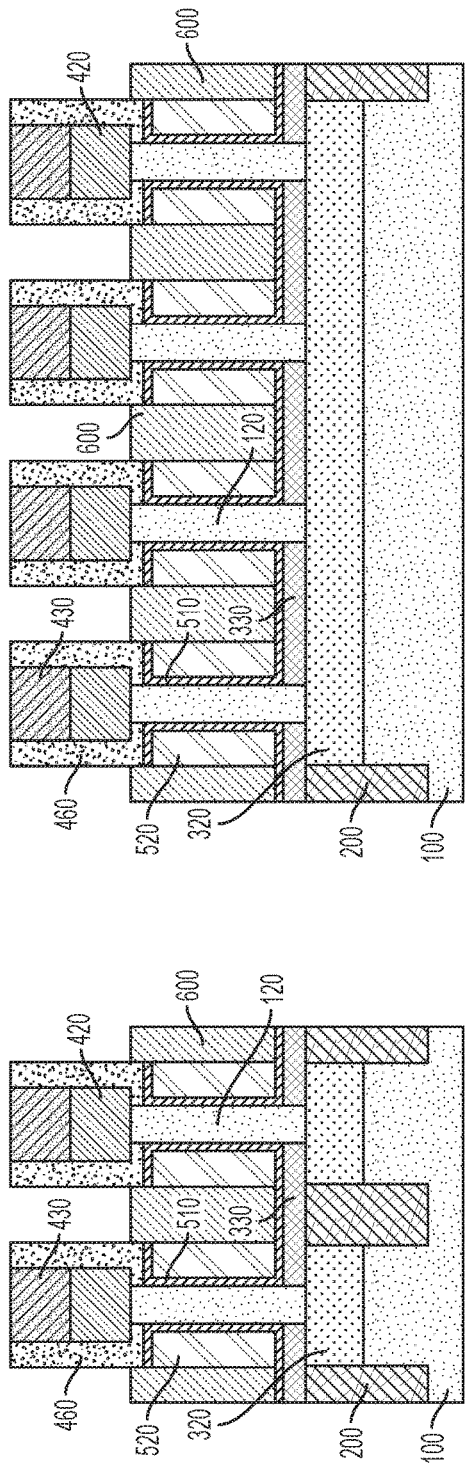
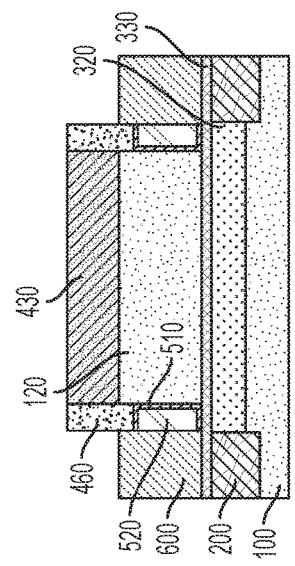

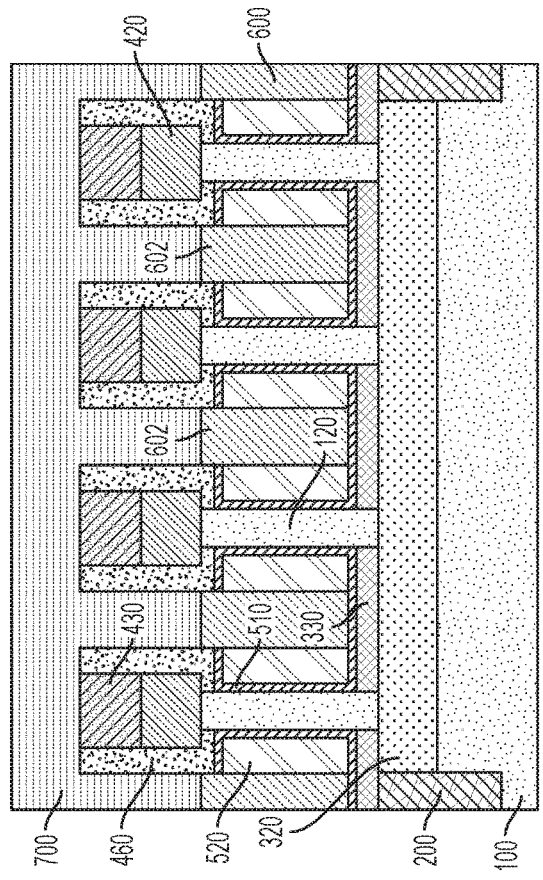
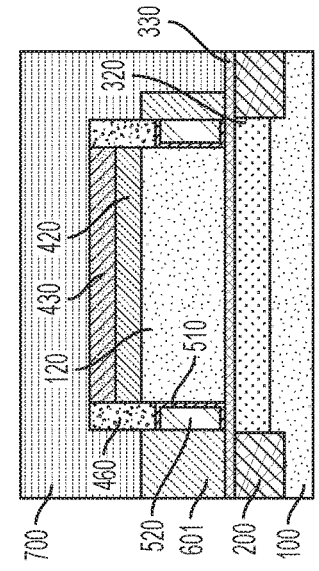
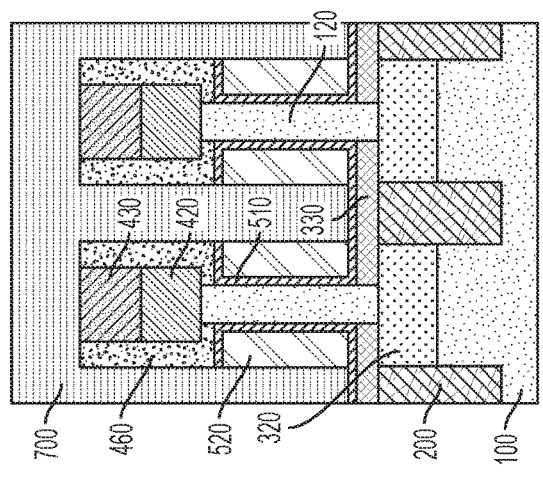
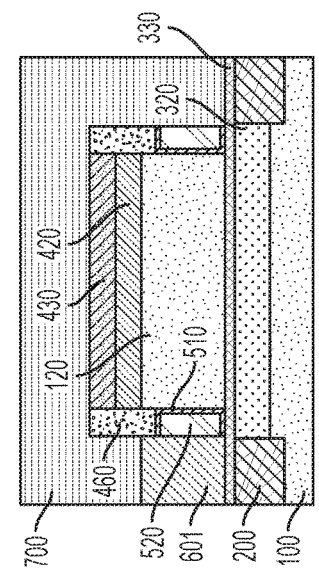

VERTICAL FIN GATE STRUCTURE FOR RF DEVICE

BACKGROUND

The present application relates generally to semiconductor devices, and more specifically to vertical field effect transistors (VFETs) and their methods of production.

The vertical fin field effect transistor structure can be used to form a wide variety of devices, including radio frequency (RF) devices. Vertical fin FETs are devices where the source-drain current flows from a source region to a drain region through a channel region of a semiconductor fin in a direction normal to a substrate surface. An advantage of the vertical FET is that the channel length is not defined by lithography, but by methods such as epitaxy or layer deposition, which enable precise dimensional control. In vertical fin field effect transistor (FinFET) devices, the fin defines the transistor channel with the source and drain regions located at opposing (i.e., upper and lower) ends of the fin.

Aggressive scaling of semiconductor devices, including complementary metal oxide semiconductor (CMOS) devices, and the attendant decrease in critical dimension (CD) may result in increased resistance between conductive elements, including the gate contacts, due to a decreased contact area between conductive regions and the resistivity of the individual conductive layers. In particular, with critical dimension (CD) scaling decreases below the 55 nm node, it has been demonstrated that the cut-off frequency ($F_e$) in RF devices increases while the maximum achievable frequency ($F_{max}$) disadvantageously decreases.

SUMMARY

Notwithstanding recent developments, it would be beneficial to provide methods and structures for manufacturing advanced node vertical FinFET devices that decrease the contact resistance amongst conductive layers, including the gate contacts, without altering the principal design rules.

As disclosed herein, a vertical FinFET architecture includes a conductive metal layer disposed between adjacent fins of a multi-fin device. The metal layer, which is in electrical contact with a work function metal layer, is adapted to decrease the overall resistance of the gate contact for the device. A lower gate contact resistance can improve the reliability and performance of the device, particularly in radio frequency (RF) applications. The metal layer can also extend laterally to provide a contact region for a gate contact.

In accordance with embodiments of the present application, a method of making a vertical FinFET device includes forming a plurality of fins over a semiconductor substrate, wherein the fins define an inter-fin space between sidewalls of adjacent fins, forming a gate dielectric directly over the sidewalls of the fins, and forming a work function metal layer directly over the gate dielectric. A conductive metal layer is then formed over the work function metal layer, such that a first portion of the conductive metal layer extends laterally from an endwall of each of the fins over the semiconductor substrate.

In further embodiments, a vertical FinFET device includes a plurality of fins disposed over a semiconductor substrate, where the fins define an inter-fin space between sidewalls of adjacent fins. A gate dielectric is disposed directly over the sidewalls of the fins, and a work function metal layer overlies the gate dielectric. A conductive metal layer is disposed over the work function metal layer, such that a first portion of the conductive metal layer extends laterally from the work function metal layer over the semiconductor substrate.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIGS. 2A and 2B show the formation of an extended gate (EG) oxide layer over the fins of FIGS. 1A and 1B, respectively, the formation of a sacrificial gate over the EG oxide layer and extending between adjacent fins, and a planarized dielectric layer disposed over the sacrificial gate;

FIGS. 3A and 3B depict the formation of openings in the dielectric layer exposing a top surface of the fins, the formation of top source/drain regions over the exposed fins, and the formation and planarization of a nitride capping layer over the top source/drain regions;

FIGS. 4A and 4B show removal of remaining portions of the dielectric layer and the formation of sidewall spacers over sidewalls of the top source/drain regions and respective nitride capping layers;

FIGS. 5A, 5B and 5C show removal of the sacrificial gate and removal of the EG oxide layer, and the formation of a self-aligned work function metal layer over sidewalls of the fins beneath the sidewall spacers;

FIGS. 6A, 6B and 6C show the deposition and recess etch of a conductive layer between adjacent fins;

FIGS. 8A, 8B, 8C and 8D show the deposition of an interlayer dielectric (ILD) over the structure of FIGS. 7A, 7B, 7C and 7D following removal of the etch mask;

DETAILED DESCRIPTION

Figure 1B:
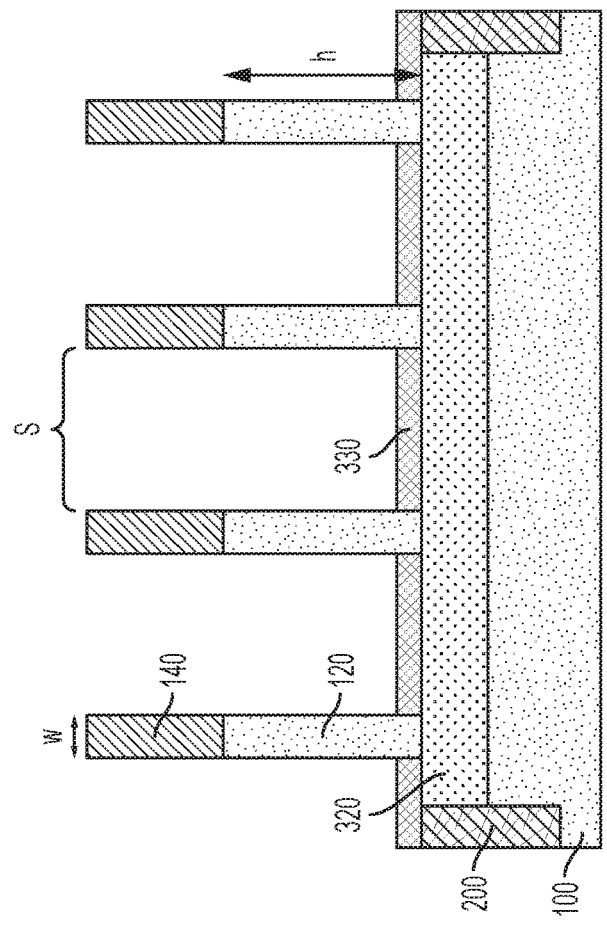
FIGS. 1A and 1B are simplified cross-sectional schematic diagrams of vertical FinFET structures showing, at an intermediate stage of fabrication, a pair of single fin devices and a four fin device, respectively, following the formation of bottom source/drain regions and a bottom spacer layer according to various embodiments.

Reference will now be made in greater detail to various embodiments of the subject matter of the present application, some embodiments of which are illustrated in the accompanying drawings. The same reference numerals will be used throughout the drawings to refer to the same or similar parts.

According to various embodiments, vertical FinFETs may be incorporated into radio frequency (RF) devices and configured as single fin (e.g., logic) as well as multi-fin architectures. In multi-fin RF devices, parallel transistors may share a common gate electrode. However, at high operating frequencies, e.g., greater than 30 kHz, the gate resistance of the transistors is relatively large for advanced node devices, which induces an RC (resistance-capacitance) time constant with nearby capacitances, causing an undesired decrease in the maximum operating frequency for the device and associated timing delays.

In view of the foregoing, disclosed herein are vertical FinFET structures that exhibit an improved (decreased) gate resistance as well as methods of forming such structures. Exemplary methods and corresponding structures are described herein with particular reference to FIGS. 1-11, which illustrate both single fin and multi-fin device architectures.

Figure 1A:
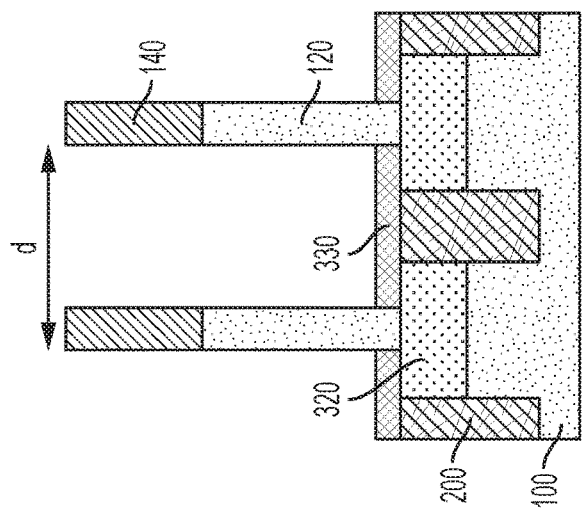

Referring to FIG. 1A and FIG. 1B, cross-sectional schematic diagrams of vertical FinFET structures at an intermediate stage of fabrication include a pair of single fin devices (FIG. 1A) and a four fin device (FIG. 1B). In each of the device structures, a plurality of semiconductor fins 120 are formed over a semiconductor substrate 100.

The substrate 100 may include a semiconductor material such as silicon (Si), e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries.

The substrate 100 is not limited to silicon-containing materials, however, as the substrate 100 may include other semiconductor materials, including Ge and compound semiconductors, including III-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

Semiconductor substrate 100 may be a bulk substrate or a composite substrate such as a semiconductor-on-insulator (SOI) substrate that includes, from bottom to top, a handle portion, an isolation layer (e.g., buried oxide layer) and a semiconductor material layer. In the illustrated embodiment, only the topmost semiconductor material layer of such a substrate is shown.

Substrate 100 may have dimensions as typically used in the art and may include, for example, a semiconductor wafer. Example wafer diameters include, but are not limited to, 50, 100, 150, 200, 300 and 450 mm The total substrate thickness may range from 250 microns to 1500 microns, although in particular embodiments the substrate thickness is in the range of 725 to 775 microns, which corresponds to thickness dimensions commonly used in silicon CMOS processing. The semiconductor substrate 100 may be a (100)-oriented silicon wafer or a (111)-oriented silicon wafer, for example.

Semiconductor fins 120 may be defined by a patterning process such as photolithography, which includes forming a hard mask 140 over the substrate and forming a layer of photoresist material (not shown) atop the hard mask 140. Hard mask layer 140 may include a material such as, for example, silicon nitride or silicon oxynitride, and may be deposited using conventional deposition processes, such as, for example, CVD or plasma-enhanced CVD (PECVD).

The deposited photoresist is then subjected to a pattern of irradiation, and the exposed photoresist material is developed utilizing a conventional resist developer. The pattern provided by the patterned photoresist material is thereafter transferred into the hard mask 140 and then into the substrate 100 utilizing at least one pattern transfer etching process.

Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. In several embodiments, the fins 120 are etched from, and therefore contiguous with the semiconductor substrate 100.

Each of the fins 120 may have a height (h) ranging from 5 nm to 100 nm, e.g., 5, 10, 20, 50, or 100 nm, including ranges between any of the foregoing values, and width (w) of less than 20 nm, e.g., 3, 5, 8, 10, 12 or 15 nm, including ranges between any of the foregoing values. Thus, the fins 120 define an inter-fin space or spacing (S) or gap between sidewalls of adjacent fins. The pitch (d), i.e., repeat distance, between adjacent fins 120 may range from 10 nm to 60 nm, e.g., 10, 20, 30, 40, 50 or 60 nm, including ranges between any of the foregoing values, where d=S+w. Although arrays of two fin and four fins are shown, the present disclosure is not limited to only these examples. It is noted that any number of fins 120 may be formed over the semiconductor substrate 100. According to various embodiments, plural fins are typically oriented parallel to each other and perpendicular to the library logic flow of a circuit.

In other embodiments, as known to those skilled in the art, the fin formation process may include a sidewall image transfer (SIT) process or a double patterning (DP) process.

After etching the semiconductor substrate 100 to form fins 120, isolation regions 200 such as shallow trench isolation (STI) regions may be formed in substrate 100, i.e., between fins 120, by etching regions of the substrate 100 to form trenches that are back-filled with a dielectric layer. For instance, isolation regions may include an oxide such as silicon dioxide. Shallow trench isolation (STI) 200 may be used to provide electrical isolation between the fins 120 and between adjacent devices as is needed for the circuit(s) being implemented.

A bottom source/drain region 320 is disposed within the substrate proximate to a lower portion of each fin 120. Bottom source/drain regions 320 may be formed by selective epitaxial growth from substrate 100 or by ion implantation.

The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface.

Example epitaxial growth processes include low energy plasma deposition, liquid phase epitaxy, molecular beam epitaxy, and atmospheric pressure chemical vapor deposition. An example silicon epitaxial process uses a gas mixture including $H_2$ and silane ($SiH_4$) or dichlorosilane ($SiH_2Cl_2$) at a deposition (e.g., substrate) temperature of 450-800° C. and a growth pressure (i.e., chamber pressure) of 0.1-700 Torr.

The foregoing process may be modified to form a silicon germanium ($SiGe_x$) epitaxial source/drain region. During such a process, a germanium source such as germane gas (GeH$_4$) flows concurrently into a process chamber with a silicon source and a carrier gas (e.g., H$_2$ and/or N$_2$). By way of example, the flow rate of the silicon source may be in the range of 5 sccm to 500 sccm, the flow rate of the germanium source may be in the range of 0.1 sccm to 10 sccm, and the flow rate of the carrier gas may be in the range of 1,000 sccm to 60,000 sccm, although lesser and greater flow rates may be used. By way of example, the germanium content of a silicon germanium (SiGe$_x$) source/drain region 320 may be in the range of 25 to 50 atomic percent.

Referring still to FIGS. 1A and 1B, a bottom spacer layer 330 is then formed over the shallow trench isolation and over a top surface of the substrate 100, i.e., directly over exposed portions of the bottom source/drain regions 320.

In various embodiments, formation of the bottom spacer layer 330 includes a conformal deposition process followed by the patterned removal of the spacer layer from over the top and sidewall surfaces of the fins 120, e.g., using an organic planarization layer (OPL) as an etch mask. In such embodiments, the protective organic planarization layer (not shown) is deposited over horizontal surfaces of the bottom spacer layer 330 proximate to the substrate.

As used here, "horizontal" refers to a general direction along a primary surface of a substrate, and "vertical" is a direction generally orthogonal thereto. Furthermore, "vertical" and "horizontal" are generally perpendicular directions relative to one another independent of orientation of the substrate in three-dimensional space.

The thickness of the bottom spacer layer 330 may range from 1 to 20 nm, e.g., 1, 2, 5, 10 or 20 nm, including ranges between any of the foregoing values. The bottom spacer layer 330 may include, for example, silicon dioxide (SiO$_2$). Alternatively, bottom spacer layer 330 may include other dielectric materials such as silicon nitride, silicon oxynitride, a low-k material, or any suitable combination of these materials.

As used herein, the compounds silicon dioxide and silicon nitride have compositions that are nominally represented as SiO$_2$ and Si$_3$N$_4$, respectively. The terms silicon dioxide and silicon nitride, refer to not only these stoichiometric compositions, but also to oxide and nitride compositions that deviate from the stoichiometric compositions.

Exemplary "low-k" materials include but are not limited to, amorphous carbon, fluorine-doped oxides, carbon-doped oxides, SiCOH or SiBCN. Commercially-available low-k dielectric products and materials include Dow Corning's SiLK™ and porous SiLK™ Applied Materials' Black Diamond™, Texas Instrument's Coral™ and TSMC's Black Diamond™ and Coral™. As used herein, a low-k material has a dielectric constant less than that of silicon dioxide. Bottom spacer layer 330 is adapted to isolate the bottom source/drain region from a later-formed gate.

Referring to FIG. 2A and FIG. 2B, exposed portions of the fins 120, as well as the overlying hard mask 140, may be coated with a thin conformal oxide layer, which is referred to herein as an extended gate or EG oxide layer 160. The EG oxide layer 160 may include silicon dioxide, for example, and may have a thickness of 2 to 3 nm. During the course of manufacturing the FinFET device, the EG oxide 160 may be stripped from source and drain regions of the fins and/or channel regions of the fins.

A sacrificial amorphous silicon layer 400 is then deposited over the fins 120 and patterned to form a sacrificial gate. One embodiment of a method for depositing amorphous silicon includes placing the substrate 100 into a chemical vapor deposition (CVD) reactor, and exposing the substrate to a silicon-containing gas. An example silicon-containing gas is silane (SiH$_4$), although other silicon-containing gases, including other members of the silane family such as disilane (Si$_2$H$_6$), may be used. A sacrificial layer of amorphous silicon 400 may be formed at a deposition (substrate) temperature in the range 200-550° C. at a deposition pressure in the range of 100 mTorr to 100 Torr. The amorphous silicon layer 400 may be planarized and etched back to form a layer having uniform thickness. As used herein, a "uniform" thickness varies by less than 5%, e.g., less than 2% or less than 1%.

"Planarization" and "planarize" as used herein refer to a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface.

A dielectric layer 410, is formed over the recessed layer of amorphous silicon 400 and planarized. In the illustrated embodiment, after planarization a top surface of the dielectric layer 410 is substantially co-planar with the fin hard mask 140. Dielectric layer 410 may include silicon dioxide, for example. Then, referring to FIG. 3A and FIG. 3B, openings 412 are formed in dielectric layer 410 over fins 120 and the hard mask 140 is removed to expose a top surface of the fins. In the illustrated embodiment, the patterning and etching process results in openings 412 having a width that is greater than a width of the underlying fin.

Within openings 412, an epitaxial or implanted top source/drain region 420 is formed over respective fins 120. The top source/drain regions 420 may be formed using the epitaxial methods and materials used to form the bottom source/drain regions 320.

A nitride capping layer 430 is then deposited over the top source/drain regions 420 to fill the openings 412, and a subsequent CMP step may be used to remove the overburden and planarize the structure such that a top surface of the nitride capping layer 430 is substantially co-planar with a top surface of dielectric layer 410. Nitride capping layer 430 may include silicon nitride, for example.

Referring to FIG. 4A and FIG. 4B, dielectric layer 410 can be removed using a selective etch, and a sidewall spacer 460 formed over sidewalls of the top source/drain regions 420 and sidewalls of the nitride capping layer 430.

As used herein, the terms "selective" or "selectively" in reference to a material removal or etch process denote that the rate of material removal for a first material is greater than the rate of removal for at least another material of the structure to which the material removal process is applied. For example, in certain embodiments, a selective etch may include an etch chemistry that removes a first material selectively to a second material by a ratio of 2:1 or greater, 5:1, 10:1 or 20:1.

In various embodiments, sidewall spacer formation includes a conformal deposition process such as a chemical vapor deposition (CVD) process, followed by an anisotropic etch to remove the spacer material(s) from horizontal surfaces. Sidewall spacers 460 may include silicon dioxide, silicon nitride, silicon oxynitride, a low-k material, or any suitable combination of these materials.

Referring to FIG. 5A, FIG. 5B and FIG. 5C, and in accordance with various embodiments, the layer of amorphous silicon 400 and the EG oxide layer 160 may be removed prior to depositing a gate dielectric layer 510 and a self-aligned work function metal layer 520 over the fins 120. As will be appreciated, FIGS. 5A and 5B are cross-sections through the length dimension of the fins 120, while FIG. 5C is a cross-section taken parallel to the length of any one of the fins.

The gate dielectric layer 510, which may include a high-k dielectric layer, may be deposited conformally, e.g., over exposed sidewalls of the fins 120 and over the bottom surface of each sidewall spacer 460. As used herein, a "high-k" material has a dielectric constant greater than that of silicon dioxide. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2.

The gate dielectric layer 510 may be deposited by a suitable process such as atomic layer deposition (ALD), chemical vapor deposition (CVD), physical vapor deposition (PVD), thermal oxidation, UV-ozone oxidation, or combinations thereof. The gate dielectric layer thickness may range from 1 nm to 10 nm, e.g., 1, 2, 4, 6, 8 or 10 nm, including ranges between any of the foregoing.

Deposition of the work function metal layer 520 may include atomic layer deposition (ALD) or chemical vapor deposition (CVD). The work function metal layer 520 is formed over the gate dielectric layer 510, followed by an anisotropic etch using the sidewall spacer 460 as an etch mask. Thus, the work function metal layer 520 is self-aligned beneath the sidewall spacer 460. Following the anisotropic etch, as shown in FIGS. 5A-5C, a sidewall of the work function metal layer 520 may be co-planar with a sidewall of the overlying sidewall spacer 460. In the illustrated embodiments, each work function metal layer 520 is self-aligned with an overlying sidewall spacer 460 such that the work function metal layer 520 does not extend laterally into a gate contact region of the device. The work function metal layer 520 may include titanium and titanium nitride and the like, as well as multiple layers thereof, where the thickness and composition of the work function metal layer 520 can be selected to achieve the desired work function for the transistor gate.

Referring to FIGS. 6A, 6B and 6C, a metal layer 600 is deposited directly over the gate dielectric layer 510 at the bottom of openings 522 and over the work function metal layer 520 surrounding the fins 120. Following a planarization step and a recess etch of the metal layer 600, in the illustrated embodiment a top surface of the metal layer 600 remains above a top surface of the work function metal layer 520 such that an entire sidewall surface of the work function metal layer 520 is covered by the metal layer 600. In various embodiments, a first portion 601 of the metal layer 600 is disposed over the end walls of the fins, while a second portion 602 of the metal layer 600 extends between and parallel to a length direction of a pair of adjacent fins.

Metal layer 600 may be deposited by atomic layer deposition (ALD) or chemical vapor deposition (CVD), and may include cobalt, nickel, molybdenum, tungsten, and the like. In various embodiments, the metal layer 600 is formed using a conductive material that has an electrical resistivity lower than that of the work function metal surrounding the gate, such as, e.g., a resistivity at 20° C. of less than $1 \times 10^{-7}$ ohm-m, e.g., less than $6 \times 10^{-8}$, $4 \times 10^{-8}$ or $2 \times 10^{-8}$ ohm-m.

Figure 7A:
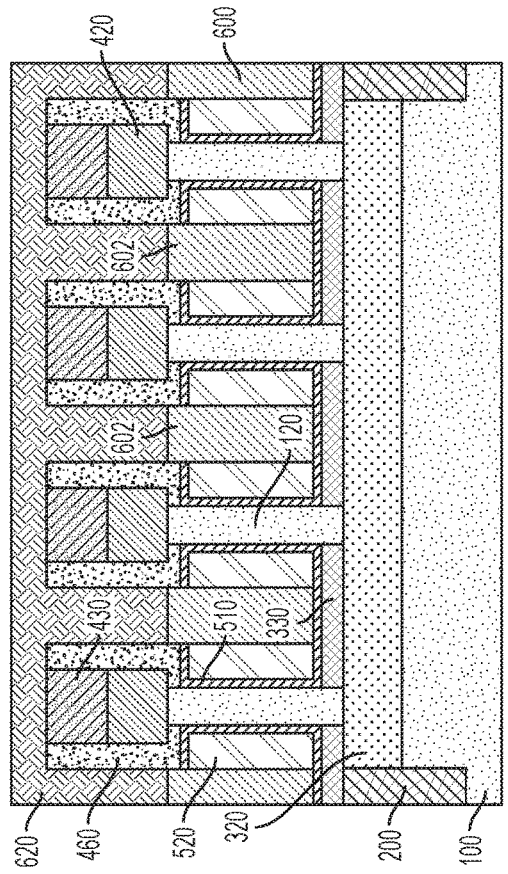
FIGS. 7A, 7B, 7C and 7D show the formation and patterning of an etch mask and the subsequent removal of unmasked portions of the conductive layer.
Figure 7B:
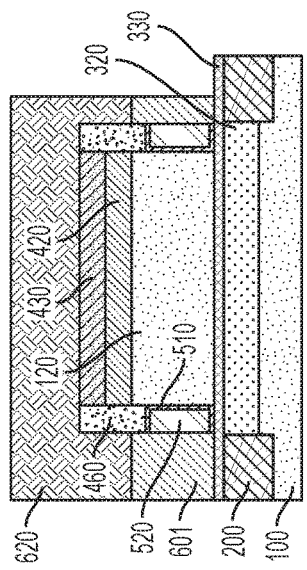
Figure 7C:
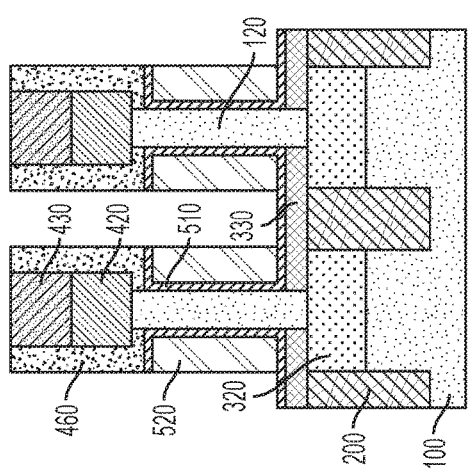
Figure 7D:
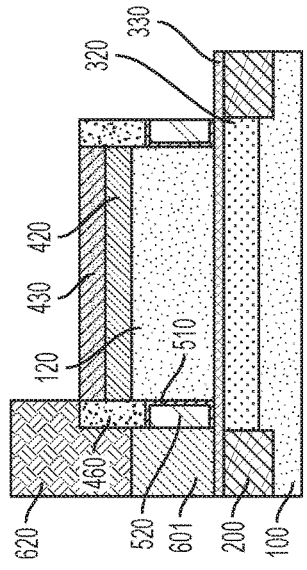

Referring to FIGS. 7A-7D, a masking layer 620, such as layer of photoresist, is deposited over the metal layer 600 and patterned using conventional photolithography techniques. FIGS. 7A and 7B are cross-sections through the length of the fins 120, while FIGS. 7C and 7D are cross-sections taken parallel to the length of any one of the fins. Using the masking layer 620 as an etch mask, the second portion 602 of the metal layer 600 can be removed from between the fins 120 of the single fin devices (FIGS. 7A and 7C) while the second portion 602 of the metal layer 600 is retained between the fins 120 of the multi-fin device (FIGS. 7B and 7D). As will be appreciated, separate bottom source/drain regions 320 underlie the fins 120 of the single fin devices, while a shared bottom source drain region underlies the fins 120 of the multi-fin device.

Referring in particular to FIGS. 7C and 7D, for both the single fin devices and the multi-fin device, a first portion 601 of the metal layer 600 extends laterally from one endwall of the fin 120 and is protected by the masking layer 620 such that the first portion 601 of the metal layer 600 is retained to form a gate contact extension region, which serves as a contact layer for later-formed gate contact metallization. As used herein "lateral" refers to a direction parallel to a major surface of a substrate.

Referring to FIGS. 8A-8D, following removal of the masking layer 620, one or more deposition steps may be used to form an interlayer dielectric 700 over exposed surfaces of the structures of FIG. 7A-7D. In certain embodiments, masking layer 620 may be removed by ashing. With reference to FIGS. 7A and 7C, the interlayer dielectric 700 is deposited between adjacent fins and over STI layer 200, and is adapted to isolate the respective work function metal layers of neighboring devices. With reference to FIGS. 7B and 7D, the interlayer dielectric is deposited directly over metal layer 600. The interlayer dielectric 700 may include CVD or ALD silicon dioxide, for example.

Figure 9A:
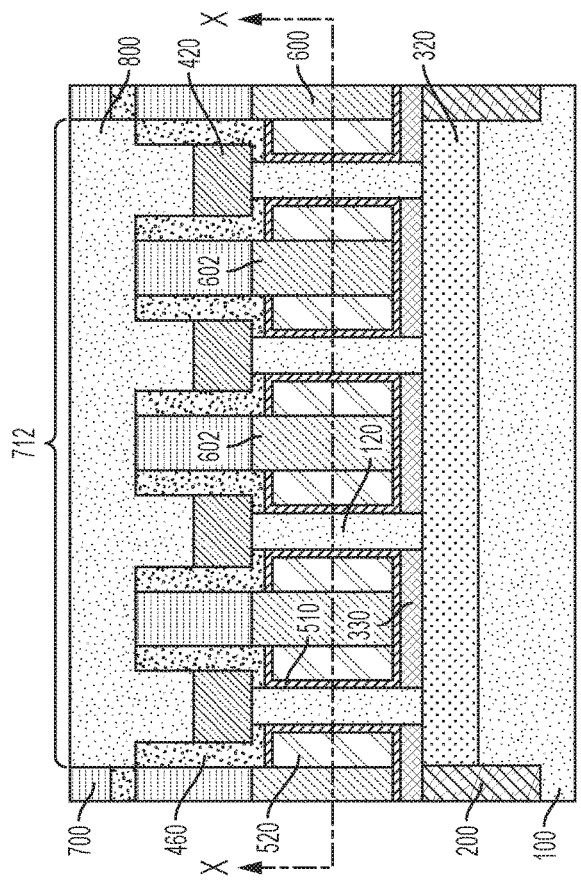
FIGS. 9A, 9B, 9C and 9D show the formation of openings in the ILD and the deposition of a metal layer within the openings and over the top source/drain regions.
Figure 9B:
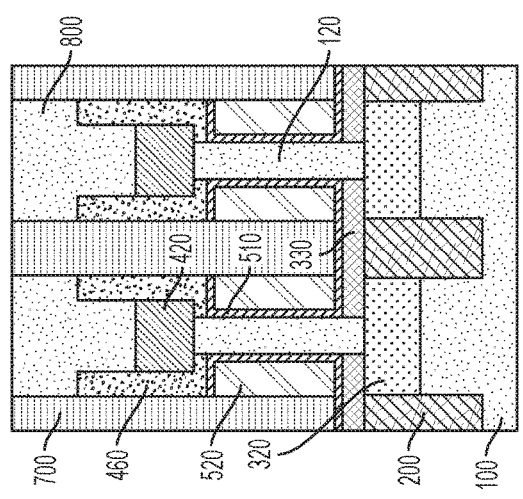
Figure 9C:
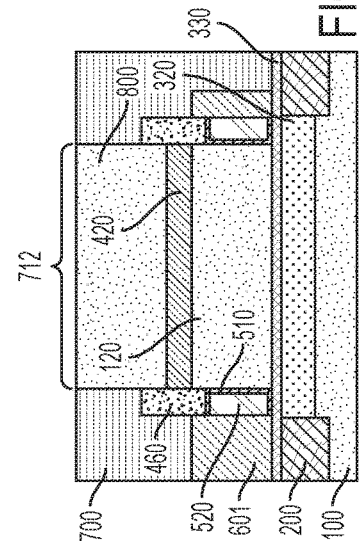
Figure 9D:
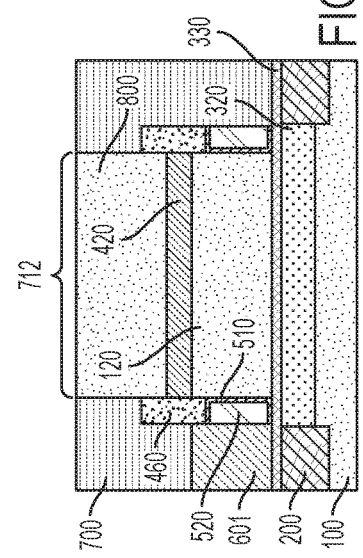
Figure 10:
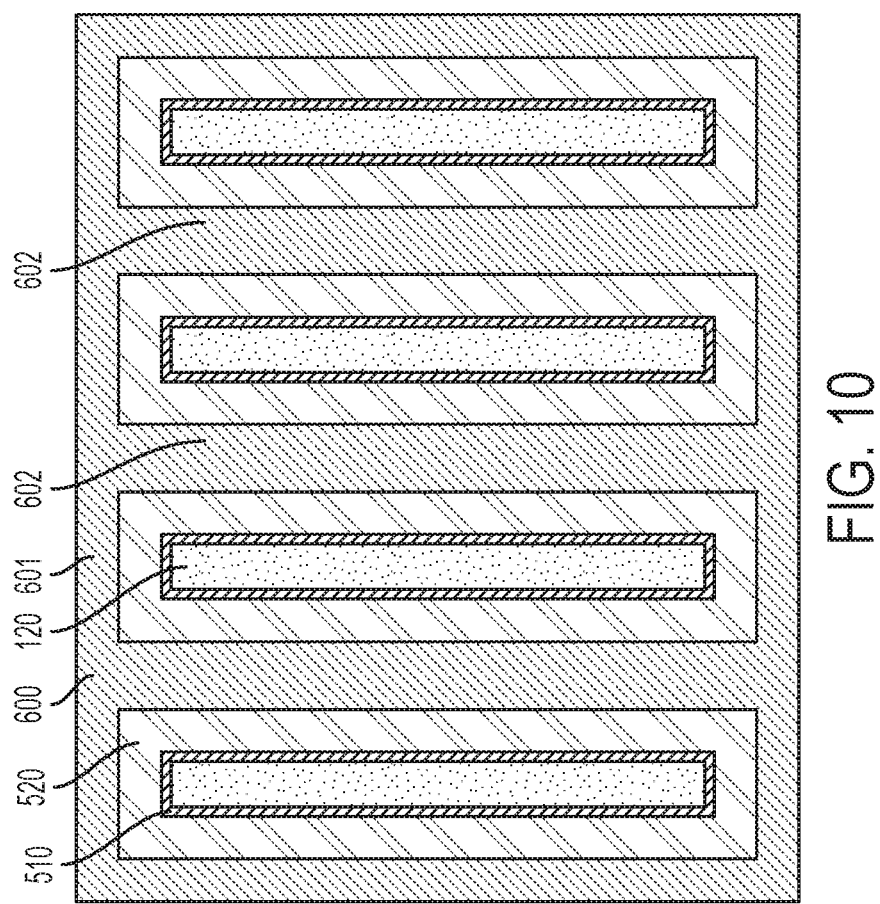
FIG. 10 is a top down view along line X of FIG. 9B showing an inlaid metal layer between adjacent fins.
Figure 11A:
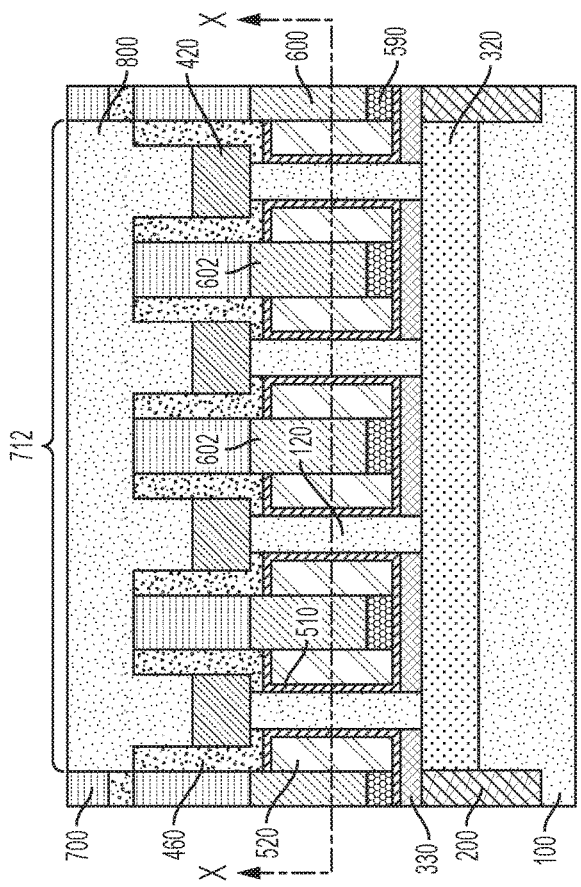
FIGS. 11A, 11B, 11C and 11D show the deposition of a dielectric layer over the gate dielectric layer between adjacent fins prior to the deposition and recess etch of a conductive layer between the fins according to further embodiments.
Figure 11B:
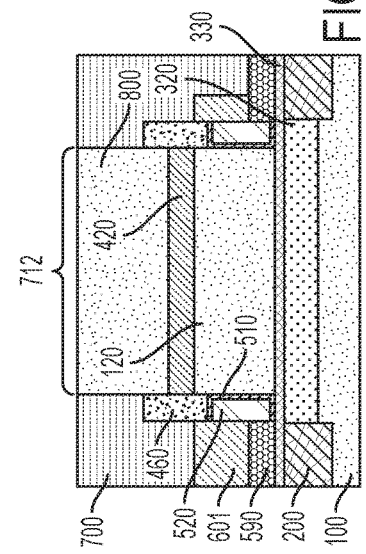
Figure 11C:
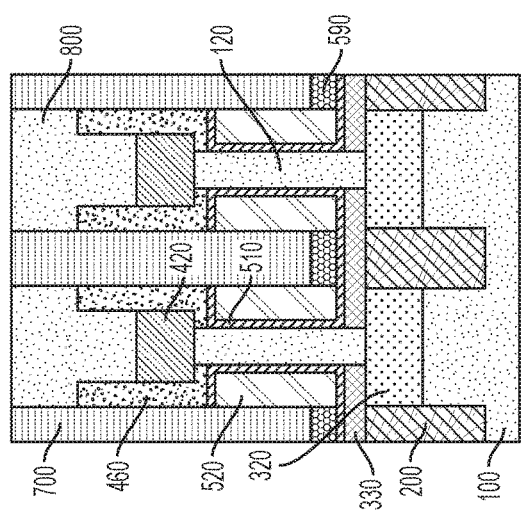
Figure 11D:
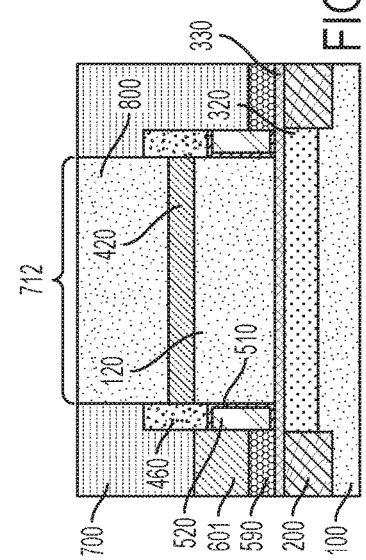

FIGS. 9A, 9B, 9C and 9D show the formation of openings 712 in the ILD 700 and the subsequent deposition and planarization of a top source/drain contact metal layer 800 within the openings 712 and directly over the top source/drain regions 420. FIG. 10 is a top down view along line X of FIG. 9B showing an inlaid metal layer 600 between adjacent fins 120.

Referring to FIGS. 11A, 11B, 11C and 11D, according to a further embodiment, and with reference again to FIGS. 5A-5C, prior to the formation of metal layer 600 an isolation dielectric layer 590 is deposited at the bottom of openings 522. By way of example, isolation dielectric layer 590 may be formed by a conformal deposition process followed by an isotropic etch back of the dielectric layer material from over the top and sidewall surfaces of the fins. The incorporation of an isolation dielectric layer 590 between the later-formed metal layer 600 and the bottom source/drain region 320 supplements the isolation provided by bottom spacer 330 and decreases the parasitic capacitance between the conductive layers.

In certain embodiments, the isolation dielectric layer 590 has a vertical thickness that is less than the vertical thickness of neighboring work function metal layer 520. By way of example, a vertical thickness of the isolation dielectric layer 590 may range from 1 to 30 nm, e.g., 1, 2, 5, 10, 15, 20, 25 or 30 nm, including ranges between any of the foregoing values. Isolation dielectric layer 590 my include silicon dioxide, SiOC, SiOCN, or other low-k dielectric materials, as well as combinations and multilayers thereof.

Disclosed are vertical FinFET device structures where an embedded metal layer 600 is effective to lower the gate resistance of the device, which enables higher frequency operation for RF devices, particularly at advanced nodes. In the example of a multi-fin device, where plural gates may be arranged in parallel and share a common gate contact, the embedded metal layer 600 decreases the overall gate resistance. In both multi-fin and single fin device architectures, the metal layer 600 may extend laterally from a self-aligned work function metal layer 520 and define a gate extension region, which may be used to form a low resistance connection to later-formed gate contact metallization.

As used herein, the singular forms "a," "an" and "the" include plural referents unless the context clearly dictates otherwise. Thus, for example, reference to a "gate conductor" includes examples having two or more such "gate conductors" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a gate dielectric that comprises hafnium oxide include embodiments where a gate dielectric consists essentially of hafnium oxide and embodiments where a gate dielectric consists of hafnium oxide.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of making a vertical FinFET device comprising:
   forming a plurality of fins over a semiconductor substrate, wherein the fins define an inter-fin space between sidewalls of adjacent fins;
   forming a bottom source/drain region within the substrate proximate to a lower portion of each of the fins;
   forming a gate dielectric directly over the sidewalls of the fins;
   forming a work function metal layer directly over the gate dielectric; and
   forming a conductive metal layer over the work function metal layer, wherein a first portion of the conductive metal layer extends laterally from an endwall of at least one fin over the semiconductor substrate, wherein forming the work function metal layer comprises:
   forming a top source/drain region over each of the fins;
   forming sidewall spacers over sidewalls of the top source/drain regions;
   depositing a metal layer over the bottom source/drain region; and
   anisotropically etching the metal layer using the sidewall spacers as an etch mask.

2. The method of claim 1, wherein the conductive metal layer comprises a metal selected from the group consisting of cobalt, nickel, molybdenum and tungsten.

3. The method of claim 1, further comprising forming a shallow trench isolation layer within the substrate peripheral to one of the fins, and forming the first portion of the conductive metal layer over the shallow trench isolation layer.

4. The method of claim 1, further comprising forming an isolation dielectric layer over the bottom source/drain region prior to forming the conductive metal layer.

5. The method of claim 1, wherein forming the conductive metal layer further comprises depositing a second portion of the conductive metal layer between adjacent fins and over the bottom source/drain region.

6. The method of claim 1, wherein forming the conductive metal layer further comprises depositing a second portion of the conductive metal layer between adjacent fins to substantially fill the inter-fin space.

7. The method of claim 6, wherein the second portion of the conductive metal layer extends parallel to a length dimension of the adjacent fins.

8. The method of claim 6, wherein the second portion of the conductive metal layer is formed over an entire sidewall surface of the work function metal layer.

9. A vertical FinFET device comprising:
   a plurality of fins disposed over a semiconductor substrate, wherein the fins define an inter-fin space between sidewalls of adjacent fins;
   a bottom spacer layer disposed over the semiconductor substrate;
   a gate dielectric disposed directly over the sidewalls of the fins;
   a work function metal layer overlying the gate dielectric; and
   a conductive metal layer disposed over the work function metal layer, wherein a first portion of the conductive metal layer extends laterally from an endwall of at least one fin over the semiconductor substrate and directly over the bottom spacer layer.

10. The vertical FinFET device of claim 9, wherein the conductive metal layer has an electrical resistivity less than that of the work function metal layer.

11. The vertical FinFET device of claim 9, wherein the conductive metal layer comprises a metal selected from the group consisting of cobalt, nickel, molybdenum and tungsten.

12. The vertical FinFET device of claim 9, wherein the first portion of the conductive metal layer extends over a shallow trench isolation layer formed in the substrate.

13. The vertical FinFET device of claim 9, further comprising a bottom source/drain region within the substrate proximate to a lower portion of each of the fins.

14. The vertical FinFET device of claim 13, wherein a second portion of the conductive metal layer is formed between adjacent fins and over the bottom source/drain region.

15. The vertical FinFET device of claim 14, wherein the second portion of the conductive metal layer extends parallel to a length dimension of the adjacent fins.

16. The vertical FinFET device of claim 14, wherein the second portion of the conductive metal layer is formed over an entire sidewall surface of the work function metal layer.

17. The vertical FinFET device of claim 13, further comprising an isolation dielectric layer disposed between the bottom source/drain region and the conductive metal layer.

* * * * *